(12) United States Patent
Shin et al.

(10) Patent No.: US 6,435,197 B2
(45) Date of Patent: Aug. 20, 2002

(54) METHOD OF CLEANING A SEMICONDUCTOR FABRICATING APPARATUS

(75) Inventors: Yong Woo Shin, Yongin; Chul Ju Hwang, Seongnam, both of (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 09/794,827

(22) Filed: Feb. 27, 2001

(51) Int. Cl.$^7$ ................................ B08B 6/00
(52) U.S. Cl. .................. 134/1.1; 134/902; 156/345; 438/905
(58) Field of Search .................. 134/1.1, 902; 438/905; 156/345; 118/723 E

(56) References Cited

U.S. PATENT DOCUMENTS

| | | | | |
|---|---|---|---|---|
| 5,043,299 A | * | 8/1991 | Chang et al. | 437/192 |
| 5,110,437 A | * | 5/1992 | Yamada et al. | 204/298.33 |
| 5,125,360 A | * | 6/1992 | Nakayama et al. | 118/730 |

\* cited by examiner

Primary Examiner—Randy Gulakowski
Assistant Examiner—M. Kornakov
(74) Attorney, Agent, or Firm—Ostrolenk, Faber, Gerb & Soffen, LLP

(57) ABSTRACT

An apparatus for fabricating a semiconductor device includes: a reactive chamber having an inlet and an outlet for a gas and being electrically grounded; a susceptor installed in the reactive chamber for mounting a wafer thereon and being electrically insulated with the reactive chamber; and an RF generator for applying an RF electric power to the susceptor. A method for cleaning the apparatus for fabricating a semiconductor device includes the steps of: injecting a plasma forming gas through the gas inlet; and moving the susceptor in the vertical direction of the face of the wafer while applying the RF electric power to the susceptor, to control the position and the density of the plasma. Since the plasma is formed even at the shadow area, such as the lower space of the susceptor within the reactive chamber where plasma could be hardly formed, there is no need to clean separately the lower space of the reactive chamber. Thus, the cleaning process is simplified. In addition, since the density of the plasma can be easily controlled without increase or decrease of the RF electric power by transferring the susceptor 140 vertically, the inside of the reactive chamber 110 can be uniformly and effectively cleaned with the plasma.

4 Claims, 4 Drawing Sheets

METHOD OF CLEANING A SEMICONDUCTOR FABRICATING APPARATUS

BACKGROUND OF THE INVENTION

1. Field of the Invention

The present invention relates to an apparatus for fabricating a semiconductor device and its cleaning method, and more particularly to an apparatus for fabricating a semiconductor device suitable to clean effectively even the shadow area of a reaction chamber, such as the lower space of a susceptor where a plasma is hardly formed, and its cleaning method.

2. Description of the Background Art

Recently, an in-situ plasma cleaning is widely used as a method for cleaning the inside of the reactive chamber of an apparatus for fabricating a semiconductor device and of a chemical vapor deposition (CVD) equipment. In this method, in order to remove a contaminant particle generator attached inside the reactive chamber, an etching gas, instead of a process gas, is flew into the reactive chamber, to which a plasma electric power is applied to activate it, thereby etching the inner wall of the reactive chamber weakly. As the etching gas, a gas containing chlorine or fluorine is typically used.

FIG. 1 is a schematic view of an apparatus for fabricating a semiconductor device in accordance with a conventional art, based on which the in-situ plasma chamber cleaning will now be described.

As shown in the drawing, a reactive chamber 10 includes an upper container 10a and a lower container 10b which are flange-coupled. An O-ring 20 is inserted at the flange portion for an effective sealing. The lower container 10b of the reactive chamber is grounded and has an inlet and an outlet (not shown). The upper container 10a of the reactive chamber is formed in a dome shape, so that the gas injected into the reactive chamber 10 is evenly dispersed and distributed on a susceptor 40.

With respect to the general CVD chamber in the dome shape, the dome is made of an insulation material such as quartz or ceramic. In this respect, since the plasma electrode 30 is installed outside the upper container 10a of the reactive chamber, encompassing the upper container 10a of the reactive chamber, it is also formed in a dome shape. The reason why the plasma electrode 30 has a dome shape is to enlarge the effective area of the plasma electrode to heighten the density of the plasma.

An RF electric power generated by an RF generator 60 is controlled by a matching box 65 to have a minimized reflectance and supplied to the plasma electrode 30.

A wafer 50 is mounted on the susceptor 40 which is installed inside the reactive chamber 10. The susceptor 40 is grounded to serve as an opposite electrode to the plasma electrode 30.

After a plasma forming gas is injected into the reactive chamber 10 through the gas inlet (not shown), when the RF electric power is applied to the plasma electrode 30, a plasma 70 is formed between the susceptor 40 and the plasma electrode 30.

In the aforementioned semiconductor device fabrication apparatus, when the CVD process is performed, a thin film is formed at the upper surface of the wafer 50, and at the same time, a contaminant film is deposited at the wall face in the chamber.

In case where the contaminant film deposited on the wall face of the chamber is cleaned by plasma dry etching of FIG. 1, the following problems arise.

First, the upper container 10a of the reactive chamber is made of metal according to circumstances. In this case, even though the RF electric power is applied to the plasma electrode, the plasma 70 is not properly formed on at the upper portion of the susceptor 40 due to a shield effect of the upper container 10a.

Secondly, since the plasma electrode is installed at the outer wall of the upper container 10a, the plasma is generated only at the upper portion of the susceptor 40. That is, geometrically, the plasma could be hardly generated at the lower portion of the susceptor 40. Thus, since the plasma is not generated at the lower portion of the susceptor 40, it is not possible to clean the lower space of the susceptor 40 with plasma. Thus, a supplementary process is further required to clean the lower space of the susceptor 40.

Thirdly, since the upper space of the susceptor 40 is comparatively large, a very intense RF electric power must be applied to make a clean by dry etching the inner wall of the reactive chamber 10a with plasma. In this case, however, some parts therein are inevitably over-etched.

SUMMARY OF THE INVENTION

Therefore, an object of the present invention is to provide an apparatus for fabricating a semiconductor device that is capable of cleaning at one time the whole reactive chamber by forming a plasma even at the shadow area, such as the lower space of a susceptor, at which it is difficult to form a plasma, and its cleaning method.

Another object of the present invention is to provide an apparatus for fabricating a semiconductor device that is capable of easily controlling the strength of a plasma by adjusting the size of a reactive space where a plasma is formed by shifting a susceptor vertically without increasing or decreasing an RF electric power, and its cleaning method.

To achieve these and other advantages and in accordance with the purpose of the present invention, as embodied and broadly described herein, there is provided an apparatus for fabricating a semiconductor device including: a reactive chamber having an inlet and an outlet for a gas and being electrically grounded; a susceptor installed in the reactive chamber for mounting a wafer thereon and being electrically insulated with the reactive chamber; and an RF generator for applying an RF electric power to the susceptor.

In the apparatus for fabricating a semiconductor device of the present invention, it is preferred that the susceptor is movable in the vertical direction of the face of the wafer.

In the apparatus for fabricating a semiconductor device of the present invention, the reactive chamber may be made of a metal, of which upper portion is preferably formed in a dome shape.

In order to reduce a plasma induced damage, the apparatus for fabricating a semiconductor device of the present invention may further includes: a remote plasma generator installed outside the reactive chamber; and a plasma transfer pipe for connecting the remote plasma generator and the reactive chamber to transfer the plasma generated from the remote plasma generator to the reactive chamber.

The apparatus for fabricating a semiconductor device may further include a heating unit for heating the reactive chamber to thereby heighten a cleaning effect.

To achieve the above objects, there is also provide a method for cleaning the apparatus for fabricating a semiconductor device including the steps of: injecting a plasma forming gas through the gas inlet; and moving the susceptor in the vertical direction of the face of the wafer while applying the RF electric power to the susceptor, to control the position and the density of the plasma.

The cleaning method of the present invention may further include the steps of: applying the RF electric power; generating a plasma of a gas containing fluorine containing gas component by the remote plasma generator; and transferring the plasma of the gas containing a fluorine component through the plasma transfer pipe to the reactive chamber.

The gas containing a fluorine component comprises $SF_6$ gas or $NF_3$ gas.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
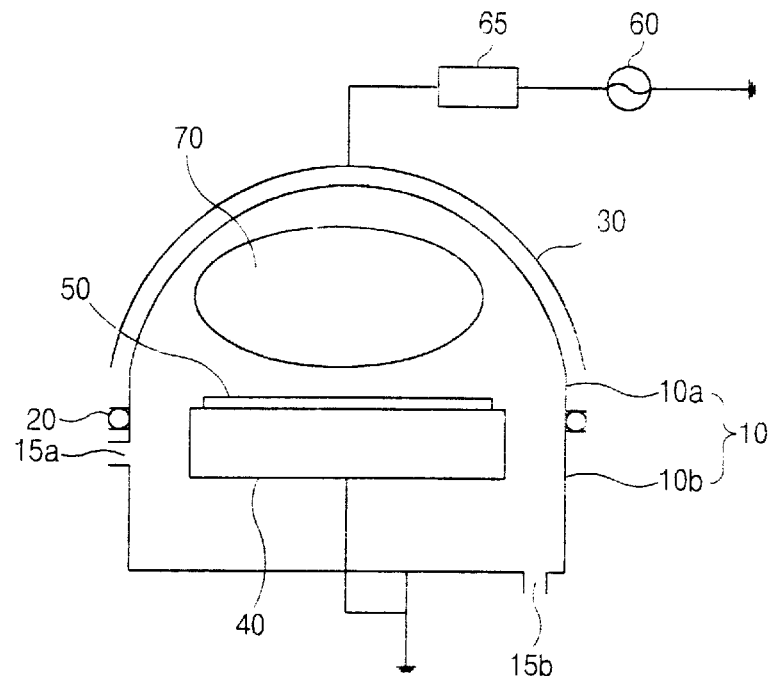
FIG. 1 is a schematic view illustrating an apparatus for fabricating a semiconductor in accordance with a conventional art.
Figure 2:
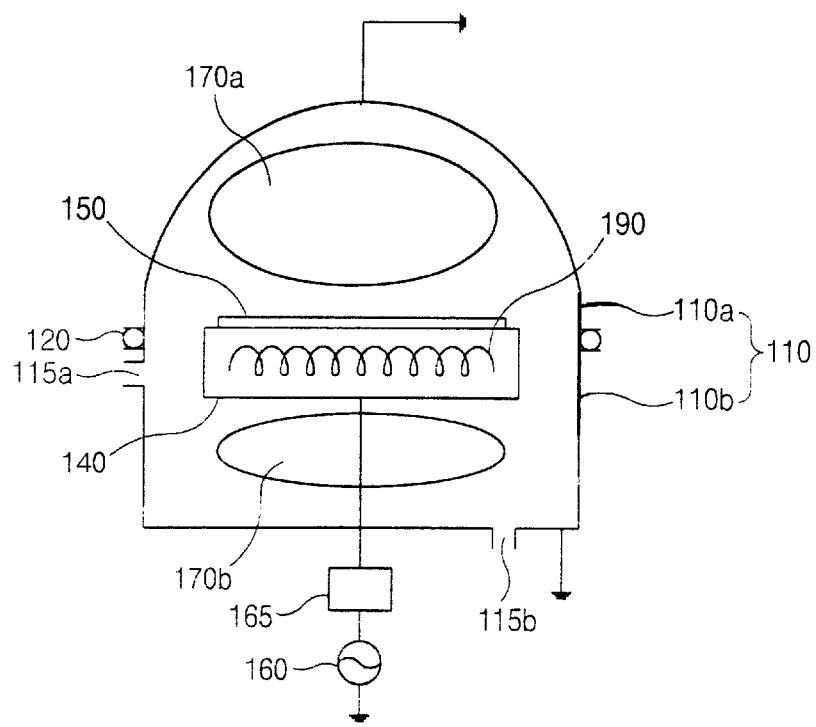
FIG. 2 is a schematic view illustrating an apparatus for fabricating a semiconductor in accordance with a first embodiment of the present invention.

FIG. 2 is a schematic view illustrating an apparatus for fabricating a semiconductor in accordance with a first embodiment of the present invention.

As shown in the drawing, a reactive chamber 110 includes an upper container 110a and a lower container 110b which are assembled to be integrated by flange coupling.

An O-ring 120 is inserted at the flange portion for an effective sealing. A gas inlet 115a and a gas outlet 115b are installed separately at the lower container 110b.

The upper and the lower containers 110a and 110b are all made of a metallic material and grounded. The upper container 110b is formed in a dome shape so that a gas injected into the reactive chamber 110 can be uniformly dispersed and distributed on a susceptor 140.

The susceptor 140 is installed to be electrically insulated with the upper and the lower containers 110a and 110b of the reactive chamber 110. The susceptor 140 is movable vertically. The upper space of the susceptor 140 can be enlarged by moving the susceptor 140 toward the bottom of the chamber, and the lower space of the susceptor 140 can be enlarged by moving the susceptor 140 toward the ceiling of the reactive chamber 110.

A wafer 150 is mounted at the upper surface of the susceptor 140, and a heating unit 190 is inserted in the susceptor 140 to heat the wafer 150.

A matching box 165 and an RF generator 160 are connected in series with the susceptor 140. The RF electric power generated from the RF generator 160 is controlled to have the minimum reflectance by the matching box 165 and supplied to the susceptor 140.

That is, in comparison with the conventional apparatus for fabricating a semiconductor device in which the plasma electrode for generating a plasma is formed in a dome shape outside the reactive chamber, in the present invention, the susceptor 140 installed inside the reactive chamber 110 serves as a plasma electrode. Thus, an extra plasma electrode is not necessary.

In addition, in the conventional art, since the plasma electrode is formed along the outer peripheral surface of the upper container 110a, the plasma is formed only at the upper space of the susceptor 140. Comparatively, however, in the present invention, since the plasma electrode (susceptor) 140 is formed at the center of the reactive chamber, plasma can be generated at both upper and lower spaces of the reactive chamber 110. As shown in FIG. 2, the plasma areas 170a and 170b are all formed at the upper and the lower spaces of the reactive chamber 110.

Figure 3:
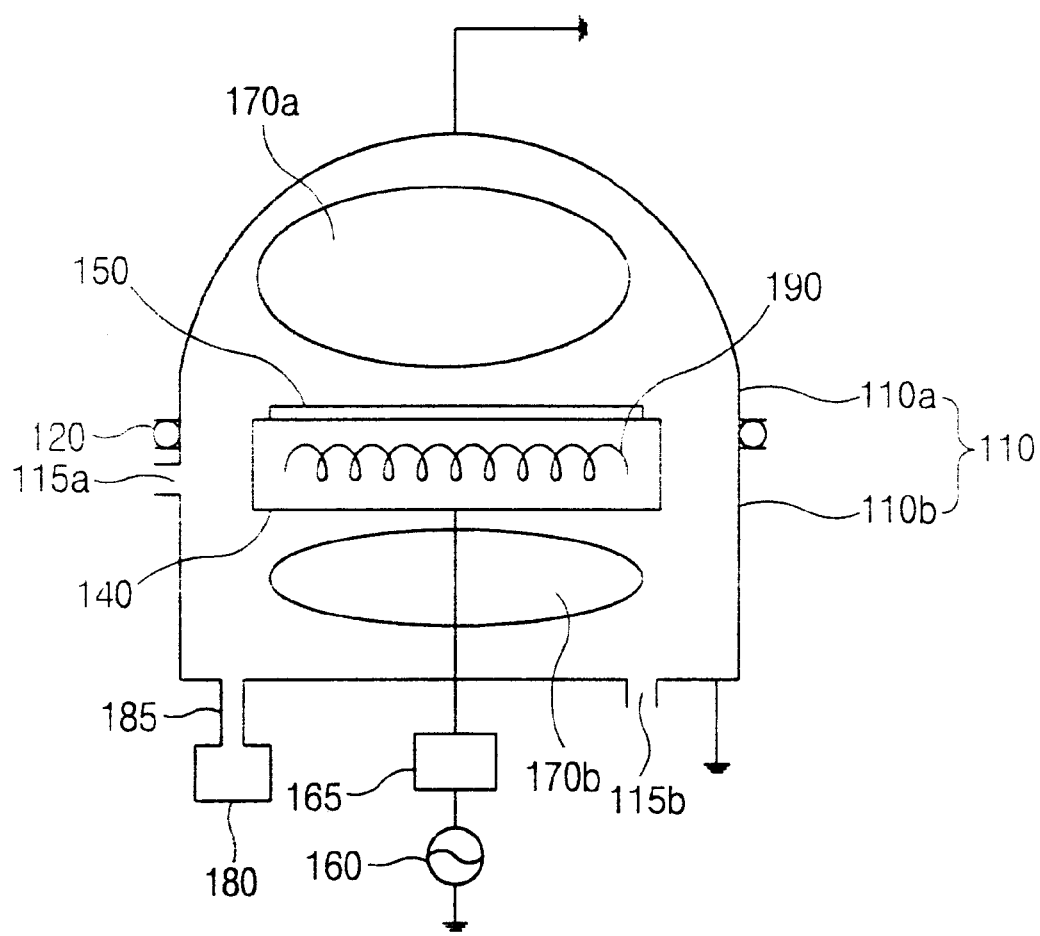
FIG. 3 is a schematic view illustrating an apparatus for fabricating a semiconductor in accordance with a second embodiment of the present invention.

FIG. 3 is a schematic view illustrating an apparatus for fabricating a semiconductor in accordance with a second embodiment of the present invention.

The same elements of FIG. 3 as those in FIG. 2 are given the same reference numerals.

The apparatus for fabricating a semiconductor device of the second embodiment of the present invention includes a remote plasma generator 180 and a transfer pipe 185 for transferring the generated plasma into the reactive chamber 110 additionally to the apparatus for fabricating a semiconductor device of the first embodiment of the present invention.

A method for cleaning the inside of the reactive chamber by using the apparatus for fabricating a semiconductor device in accordance with the first embodiment of the present invention constructed as described above will now be explained.

First, after a plasma forming gas is injected into the reactive chamber 110 through the gas inlet 115a, when the RF electric power is applied to the susceptor 140, plasmas 170a and 170b are respectively formed at the upper and the lower spaces of the susceptor 140, thereby simultaneously etching the inner wall face of the upper and the lower containers 110a and 110b of the reactive chamber 110, thereby cleaning.

In this manenr, the RF electric power is applied to the susceptor 140 installed at the central portion of the reactive chamber 110, the plasma 170a is formed at the upper portion of the susceptor 140 inside the reactive chamber 110a and the plasma 170b is formed at the lower portion of the susceptor 140.

Accordingly, the upper container 110a and the lower container 110b of the reactive chamber 110 can be all cleaned with the plasma.

Since the susceptor 140 is formed movable vertically, the size of the upper space and the lower space can be controlled according to the position of the susceptor, and thus, even in a state that a predetermined RF electric power is applied to the susceptor 140, the position and the density of the plasmas 170a and 170b of the upper and the lower spaces can be easily controlled. Consequently, the inside of reactive chamber can be uniformly cleaned by moving the susceptor vertically.

However, according to a result of experiment on the cleaning degree of the contaminant film of the inner wall face of the reactive chamber, it was noted that the cleaning degree of the inner wall face of the reactive chamber at the lower side of the susceptor was somewhat low compared to that of the inner wall face of the chamber at the upper side of the susceptor. The reason for this is believed that the plasma 170b formed at the lower area of the susceptor 140 has a lower density than that of the plasma 170a formed at the upper area.

In addition, since the supplementary units such as the heating unit are installed at the lower portion of the susceptor, the susceptor is not possibly lowered down completely to the bottom of the chamber. Accordingly, the cleaning degree of the contaminant film in the vicinity of the bottom surface of the chamber is degraded compared to that of the upper portion at the chamber.

Consequently, in order to completely clean the contaminant of the inner wall face of the reactive chamber 110 at the lower side of the susceptor 140, the RF electric power to be applied to the susceptor 140 is preferred to be high. As noted in the graph of FIG. 4C, the higher the RF electric power is, the higher the etching rate of the contaminant film deposited on the inner wall face of the reactive chamber is.

In this respect, however, if the RF electric power is set excessively high, a self DC bias is increased at the upper area of the susceptor 140. Then, the strength that ions of the plasma collide to the inner wall face of the reactive chamber 110 and to the susceptor 140 is intensified, causing a problem of overetching which would physically damages the inner wall face of the reactive chamber.

Accordingly, the apparatus for fabricating a semiconductor device and its cleaning method in accordance with the second embodiment of the present invention additionally includes the remote plasma generator 180 and the transfer pipe 185 to the apparatus of the first embodiment, to reduce the RF electric power to be applied to the susceptor 140 to generate the plasma in the reactive chamber 110.

That is, the plasma is generated in the reactive chamber 110 by applying the RF electric power to the susceptor 140, and at the same time, the high density plasma is generated from the remote plasma generator 180 and transferred into the chamber 110 to complement the plasma, thereby reducing the amount of plasma to be generated within the chamber 110.

Accordingly, an effect is obtained that the apparatus for fabricating a semiconductor device can be uniformly cleaned without any physical damage to the inner wall face of the reactive chamber 110.

The etching gas for cleaning the inside of the chamber can be variably selected depending on a process performed for the semiconductor device fabricating apparatus. For example, in case that the semiconductor device fabricating apparatus performs a process for forming a silicon oxide, $SF_6$ gas or a mixture of $NF_3$ gas and Ar gas is used.

FIGS. 4A through 4D show data obtained by performing a thin film deposition process on the wafer under the condition of a below Table 1 and by performing a plasma cleaning process under the condition of a below Table 2.

In detail, FIGS. 4A through 4D shows that etching rates by portions in the reactive chamber were measured by varying the wafer temperature, a position of the susceptor, the RF electric power and the Ar flow amount among the conditions proposed in Table 2. In this respect, the position of the susceptor indicates the distance moved from a home position by taking the home position as a reference. The home position is a position where the dome shape upper container and the lower container contact with each other, that is, the flange junction portion.

With reference to FIGS. 4A through 4D, a plot "●" indicates the etching rate of the contaminant film attached on the inner wall face of the reactive chamber at the upper portion of the susceptor, a plot "■" indicates the etching rate of the contaminant film of the inner wall face of the reactive chamber where the susceptor is positioned, and a plot "▲" indicates the etching rate of the contaminant film attached on the inner wall face of the reactive chamber at the lower portion of the susceptor.

Figure 4A:
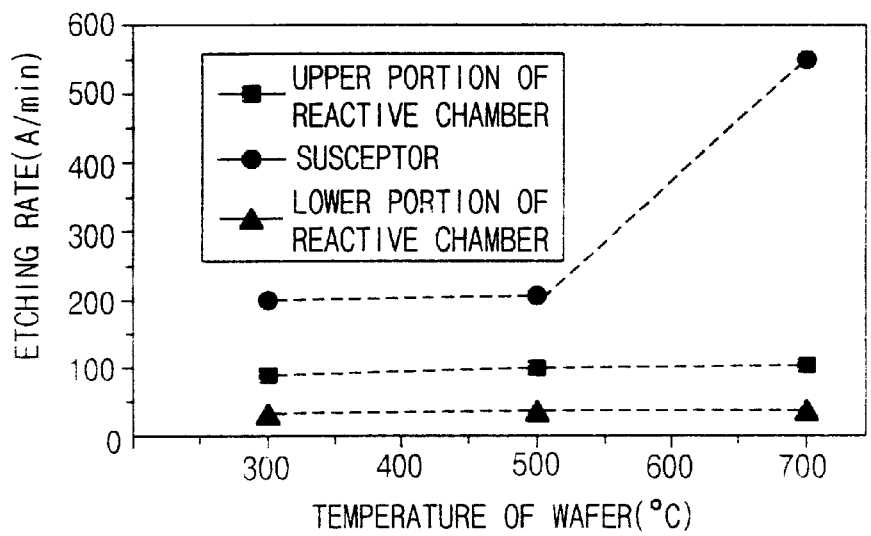
FIGS. 4A through 4D show data obtained by performing a plasma cleaning process by using the apparatus for fabricating a semiconductor device of FIG. 2 in accordance with the present invention.

It is noted from FIG. 4A, at a temperature of higher than 500° C., as the temperature of the wafer increases, the cleaning degree of the reactive chamber at the upper space of the susceptor 140 increases, but there is no change in the cleaning degree of the contaminant space of the susceptor 140.

In other words, in the case that the cleaning is performed at a temperature higher than 500° C., the cleaning degree between the upper space and the lower space of the reactive chamber is not uniform. Consequently, the temperature for the wafer is preferred to be set at about 500° C. to perform cleaning to have a uniformity of the cleaning between the upper space and the lower space of the reactive chamber.

Figure 4B:
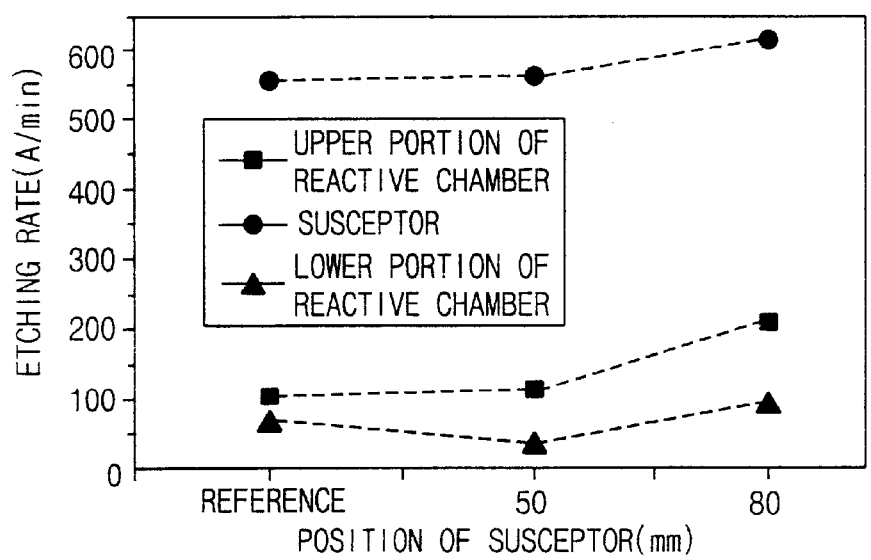

FIG. 4B shows cleaning degrees of the wall face of the reactive chamber at the upper side of the susceptor and of the wall face of the reactive chamber at the lower side of the susceptor, in case that the susceptor 140 is placed higher than a reference position.

Figure 4C:
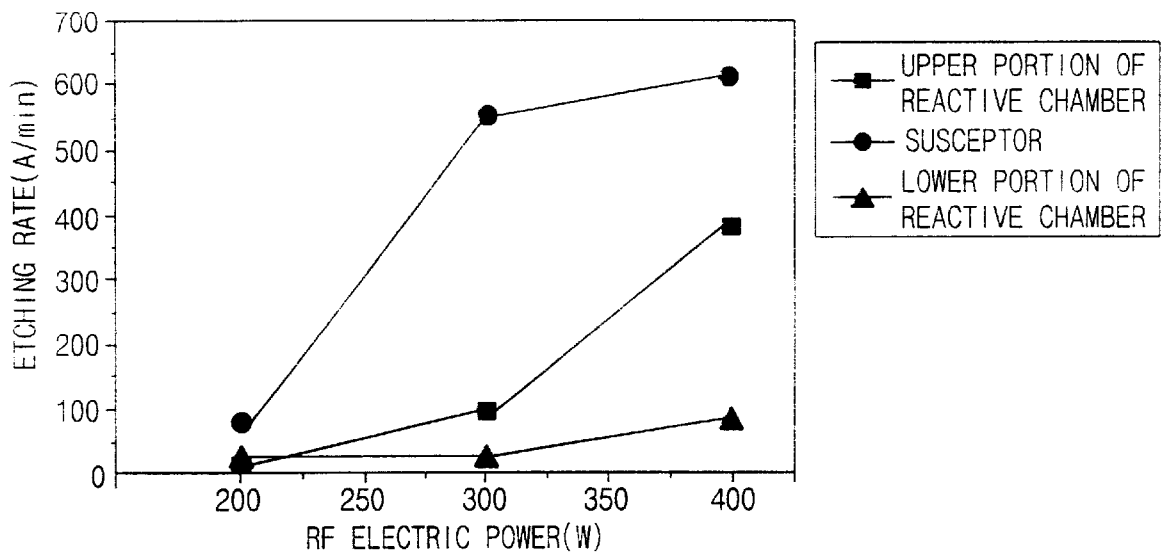

FIG. 4C shows a variation in the cleaning effect according to increase of the RF electric power applied to the susceptor 140, from which it is noted that as the RF electric power is increased, the cleaning effect is improved boat at the upper space and the lower space of the susceptor.

Figure 4D:
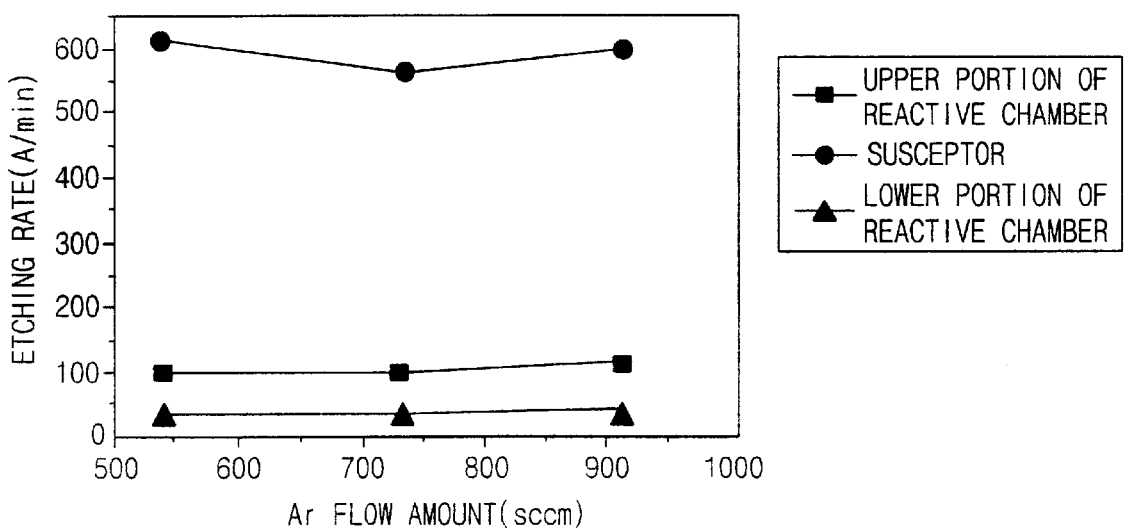

FIG. 4D shows a variation in the cleaning degree within the reactive chamber according to a variation of a flow amount of Ar gas flowing into the reactive chamber 110, from which it is noted that the flow amount of Ar gas does not influence much on the cleaning degree within the reactive chamber.

Thus, with reference to FIGS. 4A through 4D, though the etching rates (the cleaning degree) of the contaminant film of the inner wall face of the reactive chamber in the four cases are different depending on the temperature of the wafer, the position of the susceptor, and the RF electric power generating plasma and the flow amount of the Ar gas, it is note that the contaminant film on the inner wall face of the reactive chamber at the lower space of the susceptor is substantially etched commonly in each case. Namely, the lower space of the susceptor can be cleaned without an extra cleaning process.

In addition, according to the experiment result, the contaminant film formed on the inner wall face of the reactive chamber 110 was all etched resultantly to be cleaned, and in this respect, no overetching occurs.

TABLE 1

| Deposition condition | Si$_2$H$_6$ supply flow amount | 10 sccm |
| --- | --- | --- |
| | Deposition pressure | 2.11 × 10$^{-4}$ torr |
| | Deposition time | 40 minutes |

TABLE 2

| RF electric power | 300 W | SF$_6$ flow amount | 130 sccm |
| --- | --- | --- | --- |
| Position of susceptor by taking home position as a reference | 50 mm | Ar flow amount | 720 sccm |
| Pressure | 25 mtorr | Wafer temperature | 700° C. |

As so far described, the apparatus for fabricating a semiconductor device has the following advantages.

That is, first, since the plasma is formed even at the shadow area, such as the lower space of the susceptor within the reactive chamber where plasma could be hardly formed, there is no need to clean separately the lower space of the reactive chamber. Thus, the cleaning process is simplified.

Secondly, since the density of the plasma can be easily controlled without increase or decrease of the RF electric power by transferring the susceptor 140 vertically, the inside of the reactive chamber 110 can be uniformly and effectively cleaned with the plasma.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for cleaning a semiconductor device fabricating apparatus which includes a reactive chamber having an upper part and a lower part which are grounded respectively and a susceptor installed inside and insulated within the chamber, the method comprising the steps of:

introducing a reactive gas into the chamber;

applying RF power to the susceptor to generate plasma at a first region between the upper part of the chamber and the susceptor and at the second region between the lower part of the chamber and the susceptor, so that both of the first and the second regions in the chamber can be cleaned simultaneously; and moving the susceptor in a vertical direction to control the position and the intensity of the generated plasma without changing the power thereof.

2. The method of claim 1, wherein the step of generating plasma is performed simultaneously with a step of controlling the position and density of the plasma.

3. The method of claim 1, wherein the gas contains a flourine component.

4. The method of claim 3, wherein the fluorine component containing gas is SF$_6$ or NF$_3$.

* * * * *